United States Patent
Hsu et al.

(10) Patent No.: US 11,695,439 B2
(45) Date of Patent: *Jul. 4, 2023

(54) SEMICONDUCTOR CHIP WITH LOCAL OSCILLATOR BUFFER REUSED FOR SIGNAL TRANSMISSION AND ASSOCIATED TRANSMISSION METHOD

(71) Applicant: MEDIATEK INC., Hsin-Chu (TW)

(72) Inventors: Jui-Lin Hsu, Hsinchu (TW); Yen-Tso Chen, Hsinchu (TW); Hsiang-Yun Chu, Hsinchu (TW); Jen-Hao Cheng, Hsinchu (TW); Wei-Hsiu Hsu, Hsinchu (TW); Tzu-Chin Lin, Hsinchu (TW); Chih-Ming Hung, San Jose, CA (US); Jing-Hong Conan Zhan, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/505,605

(22) Filed: Oct. 19, 2021

(65) Prior Publication Data

US 2022/0140849 A1     May 5, 2022

Related U.S. Application Data

(60) Provisional application No. 63/107,569, filed on Oct. 30, 2020.

(51) Int. Cl.
*H04B 1/40*     (2015.01)
*H04B 1/48*     (2006.01)
(Continued)

(52) U.S. Cl.
CPC ............. *H04B 1/086* (2013.01); *H01L 23/66* (2013.01); *H04W 92/00* (2013.01)

(58) Field of Classification Search
CPC ........ H04B 1/086; H04B 1/48; H04B 17/309; H04B 17/0087; H04B 17/318;
(Continued)

(56) References Cited

U.S. PATENT DOCUMENTS

| 9,893,728 B2 | 2/2018 | Song |
| 10,284,236 B1 | 5/2019 | Trotta |

(Continued)

FOREIGN PATENT DOCUMENTS

| EP | 1 681 764 A2 | 7/2006 |
| TW | 202036983 A | 10/2020 |
| WO | 2008/089574 A1 | 7/2008 |

OTHER PUBLICATIONS

Lambros Dermentzoglou et al., A Build-In Self-Test Technique for RF Mixers, 2010, IEEE, p. 88-92, XP031694657.

(Continued)

*Primary Examiner* — Andrew Wendell
(74) *Attorney, Agent, or Firm* — Winston Hsu

(57) ABSTRACT

A semiconductor chip includes a first wireless communication circuit, a local oscillator (LO) buffer, and an auxiliary path. The first wireless communication circuit has a signal path, wherein the signal path has a mixer input port and a signal node distinct from the mixer input port. The auxiliary path is used to electrically connect the LO buffer to the signal node of the signal path. The LO buffer is reused for a transmit (TX) function through the auxiliary path.

24 Claims, 13 Drawing Sheets

(51) Int. Cl.
*H04B 1/08* (2006.01)
*H01L 23/66* (2006.01)
*H04W 92/00* (2009.01)

(58) Field of Classification Search
CPC .......... H04B 17/327; H04B 1/04; H04B 1/16; H04B 1/40; H04B 3/18; H04B 1/24; H01L 23/66; H04W 92/00
See application file for complete search history.

(56) References Cited

U.S. PATENT DOCUMENTS

| | | |
|---|---|---|
| 2004/0189388 A1 | 9/2004 | Nguyen |
| 2005/0069056 A1 | 3/2005 | Willingham |
| 2009/0098831 A1* | 4/2009 | Deng .................. H04B 1/0483 455/73 |
| 2010/0151806 A1 | 6/2010 | Firoiu |
| 2011/0218755 A1 | 9/2011 | Dhayni |
| 2014/0030991 A1 | 1/2014 | Liu |
| 2014/0241335 A1* | 8/2014 | Chen ...................... H03L 7/093 327/156 |
| 2016/0174094 A1 | 6/2016 | Waheed |
| 2017/0005738 A1* | 1/2017 | Stampalia .............. H04B 17/14 |
| 2018/0188317 A1 | 7/2018 | Maiellaro |
| 2019/0303348 A1* | 10/2019 | Manglani ............ G06F 9/30123 |
| 2020/0351001 A1 | 11/2020 | Komori |
| 2021/0181326 A1* | 6/2021 | Kurvathodil .......... G01S 7/4008 |
| 2022/0140848 A1* | 5/2022 | Hsu ......................... H03H 7/42 455/552.1 |

OTHER PUBLICATIONS

Dallas L. Webster et al., Replacing Error Vector Magnitude Test with RF and Analog BISTs, IEEE Design & Test of Computers, Copublished by the IEEE CS and the IEEE CASS, Nov./Dec. 2011, p. 66-75, XP011397104.

Jerzy J. Dąbrowski et al., Built-in Loopback Test for IC RF Transceivers, IEEE Transactions on Very Large Scale Integration (VLSI) Systems, vol. 18, No. 6, Jun. 2010, p. 933-946, XP011297299.

Hsu, the specification, including the claims, and drawings in the U.S. Appl. No. 17/504,491, filed Oct. 18, 2021.

Hsu, the specification, including the claims, and drawings in the U.S. Appl. No. 18/104,761, filed Feb. 1, 2023.

* cited by examiner

SEMICONDUCTOR CHIP WITH LOCAL OSCILLATOR BUFFER REUSED FOR SIGNAL TRANSMISSION AND ASSOCIATED TRANSMISSION METHOD

CROSS REFERENCE TO RELATED APPLICATIONS

This application claims the benefit of U.S. provisional application No. 63/107,569, filed on Oct. 30, 2020 and incorporated herein by reference.

BACKGROUND

The present invention relates to an integrated circuit design, and more particularly, to a semiconductor chip with a local oscillator (LO) buffer reused for loop-back test and/or signal transmission.

Loop-back test is a well-known technique for examining the operational characteristics of a communication system. Ina loop-back test, a test data is transmitted from a source and traverses some portions of the communication system, and ultimately returns to the source. For example, the test data is up-converted to a radio-frequency (RF) signal through a transmit (TX) chain, and then looped back to a receive (RX) chain before being transmitted via the antenna, where the RF signal is down-converted at the RX chain for further processing. Upon the return of the test data, the information content of the test data and/or the physical attributes of the test data (e.g., signal strength, signal-to-noise ratio, and other parameters of interest) can be observed and compared to the same information and/or parameters as they existed when the test data was initially transmitted. Information about the state of the portions of the communication system that the test data traversed and indications of the quality of service that is being provided can be extracted from comparing the original test data and the test data upon its return.

In some communication systems such as Radio Detection and Ranging (RADAR) systems, TX chains are located at a chip area away from a chip area where RX chains are located. A testing tone generator (TTG) may be implemented in the vicinity of RX chains to act as a TX circuit used to provide a testing tone for testing each of RX chains. However, the TTG consumes a large chip area, and is not a cost-effective solution.

In some communication systems such as RADAR systems, a low-power scan mode is an important feature. For example, a typical RADAR system with 4T4R architecture may enable only a portion of the 4T4R architecture, such as 1T1R or 1T2R, under the low-power scan mode. Once the normal TX chain (1T) is enabled under the low-power scan mode, the TX channel consumes much power due to too many blocks being enabled.

Thus, there is a need for an innovative low-cost loop-back test design and/or an innovative TX design that are applicable to a variety of communication systems, including a RADAR system, a wireless fidelity (Wi-Fi) system, a Bluetooth (BT) system, a $5^{th}$ generation (5G) wireless system, etc.

SUMMARY

One of the objectives of the claimed invention is to provide a semiconductor chip with a local oscillator (LO) buffer reused for signal transmission and an associated transmission method.

According to one aspect of the present invention, an exemplary semiconductor chip is disclosed. The exemplary semiconductor chip includes a first wireless communication circuit, a local oscillator (LO) buffer, and an auxiliary path. The first wireless communication circuit has a signal path, wherein the signal path has a mixer input port and a signal node distinct from the mixer input port. The auxiliary path is used to electrically connect the LO buffer to the signal node of the signal path, wherein the LO buffer is reused for a transmit (TX) function through the auxiliary path.

According to another aspect of the present invention, an exemplary transmission method is disclosed. The exemplary transmission method includes: electrically connecting, by an auxiliary path, a local oscillator (LO) buffer to a signal node of a signal path in a wireless communication circuit, wherein the signal path further comprises a mixer input port that is distinct from the signal node; and reusing the LO buffer for a transmit (TX) function through the auxiliary path.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
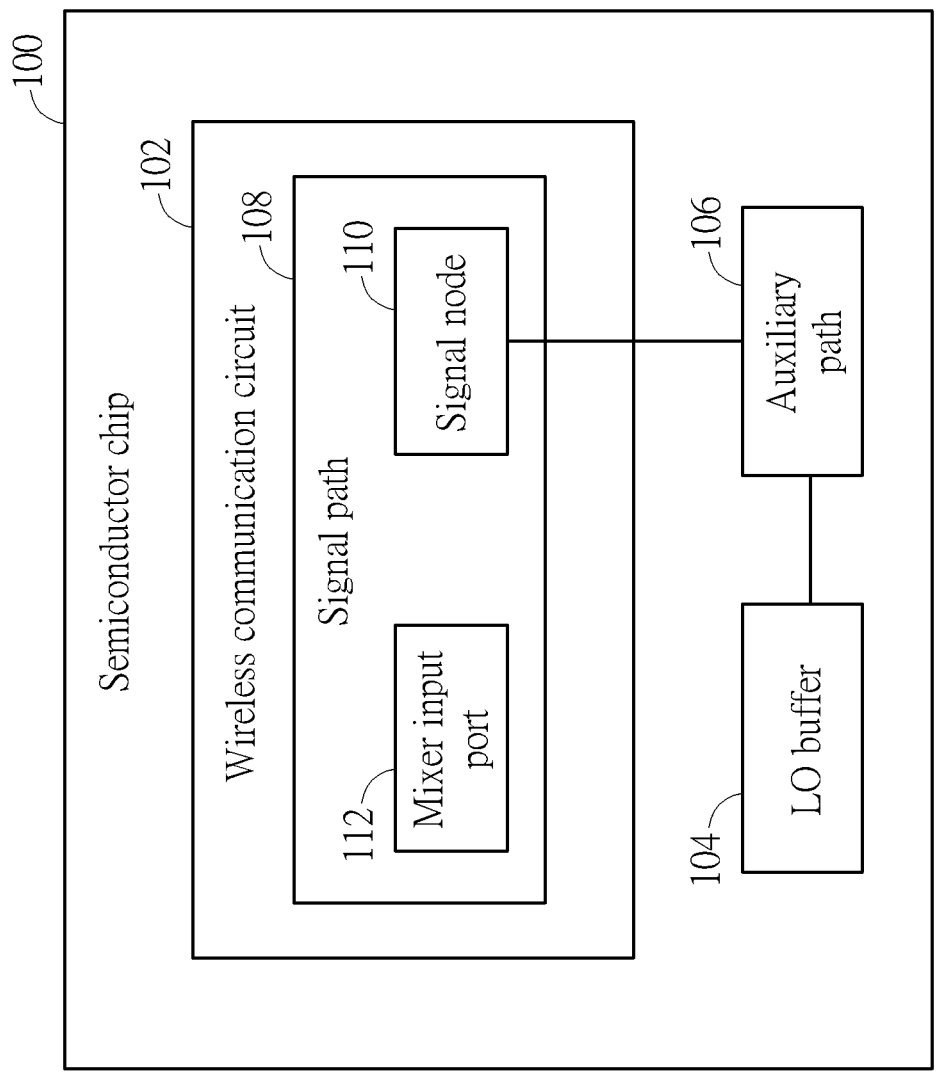
FIG. 1 is a block diagram illustrating a semiconductor chip according to an embodiment of the present invention.

FIG. 1 is a block diagram illustrating a semiconductor chip according to an embodiment of the present invention. The semiconductor chip 100 includes a wireless communication circuit 102, a local oscillator (LO) buffer 104, an auxiliary path 106, and other circuit components (not shown). The wireless communication circuit 102 includes a signal path 108 having a mixer input port 112 and a signal node 110 distinct from the mixer input port 112. The wireless communication circuit 102 may be a part of a receive (RX) circuit or a part of a transmit (TX) circuit, depending upon actual design considerations. Hence, the signal path 108 may be an RX signal path or a TX signal path. In practice, the semiconductor chip 100 may include multiple RX circuits and multiple TX circuits of a communication system, such as a RADAR system, a Wi-Fi system, a BT system, or a 5G wireless system. In a case where the wireless communication circuit 102 is a part of an RX circuit, the mixer input port 112 is arranged to receive an LO signal needed by a down-converter mixer. In another case where the wireless communication circuit 102 is a part of a TX circuit, the mixer input port 112 is arranged to receive an LO signal needed by an up-converter mixer.

The LO buffer 104 is arranged to receive and buffer an LO signal generated from a local oscillator, and may act as a TX LO buffer or an RX LO buffer, depending upon actual design considerations. That is, the LO buffer 104 is included in a wireless communication circuit that may be the same as the wireless communication circuit 102 or may be distinct from the wireless communication circuit 102, depending upon actual design considerations. The LO buffer 104 is originally designed to provide an LO signal to a mixer (e.g., down-converter mixer or up-converter mixer). In this embodiment, the auxiliary path 106 is arranged to electrically connect an output signal of the LO buffer 104 to the signal node 110 at the signal path 108, such that the LO buffer 104 can be reused for a different function. For example, the LO buffer 104 can be reused for a loop-back test function, where the loop-back test function may be performed in a manufacture test (e.g., CP (Circuit Probing or Chip Probing) or FT (Final Test)), or may be performed in a product calibration test during a normal operation. For another example, the LO buffer 104 can be reused for a TX function that may be performed during a normal operation. Furthermore, the output signal of the LO buffer 104 that is injected into the signal node 110 may be a final output of the LO buffer 104 or an intermediate output of the LO buffer 104.

For better comprehension of the proposed design of reusing the LO buffer 104 for a loop-back test function and/or a TX function, the following provides several exemplary designs, each being based on the architecture shown in FIG. 1.

Figure 2:
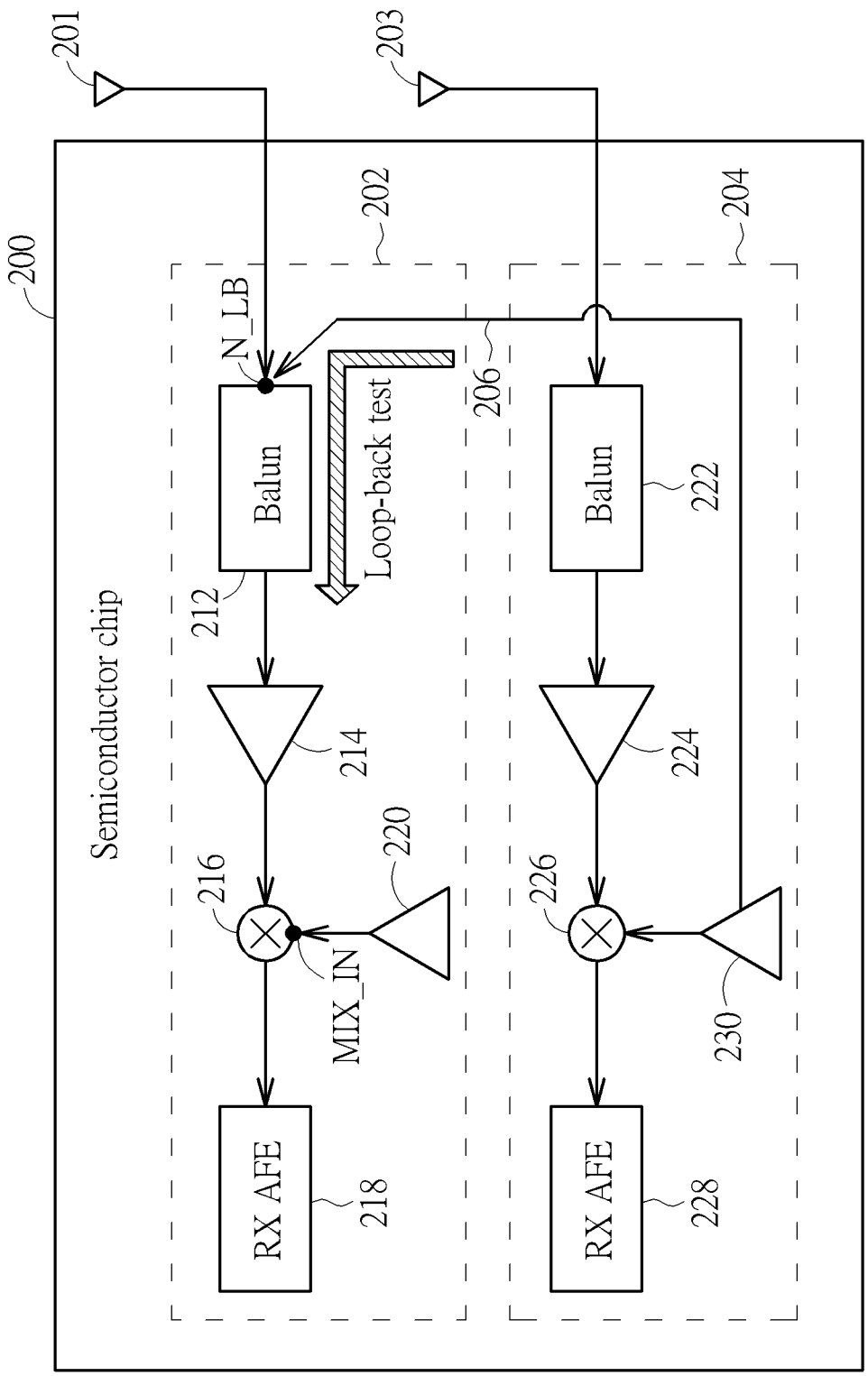
FIG. 2 is a diagram illustrating a first semiconductor chip with an LO buffer reused for loop-back test according to an embodiment of the present invention.

FIG. 2 is a diagram illustrating a first semiconductor chip with an LO buffer reused for loop-back test according to an embodiment of the present invention. The semiconductor chip 200 includes two RX circuits 202 and 204. For brevity, only two RX circuits are shown in FIG. 2. In practice, the semiconductor chip 200 may include multiple RX circuits and multiple TX circuits. The RX circuits 202 and 204 may belong to the same wireless communication system (e.g., same RADAR system) or different wireless communication systems (e.g., one RADAR system and one non-RADAR system). The RX circuits 202 and 204 may be adjacent to each other in the semiconductor chip 200, but the present invention is not limited thereto. The RX circuit 202 is coupled to an antenna 201, and includes a balanced-to-unbalanced (balun) circuit (labeled as "Balun") 212, an RX low-noise amplifier (LNA) 214, a down-converter mixer 216, an RX analog front-end circuit (labeled as "RXAFE") 218, and an RX LO buffer 220. The RX circuit 204 is coupled to an antenna 203, and includes a balun circuit (labeled as "Balun") 222, an RX LNA 224, a down-converter mixer 226, an RX analog front-end circuit (labeled as "RX AFE") 228, and an RX LO buffer 230. Each of the antennas 201 and 203 may be an antenna in package (AiP) or an antenna on board (AoB). The semiconductor chip 200 adopts the architecture shown in FIG. 1. For example, the wireless communication circuit 102 is realized by a part of the RX circuit 202; the signal path 108 is realized by an RX signal path including balun circuit 212, RX LNA 214, down-converter mixer 216 and RX analog front-end circuit, where the mixer input port 112 is realized by a mixer input port MIX_IN of the down-converter mixer 216, and the signal node 110 is realized by a signal node N_LB between balun circuit 212 and antenna 201; the LO buffer 104 is realized by the RX LO buffer 230 of the RX circuit 204; and the auxiliary path 106 is realized by an auxiliary path 206 coupled between the RX LO buffer 230 and the signal node N_LB. It should be noted that the signal node 110 (which is distinct from the mixer input port 112) may be any suitable node at the signal path 108 that can enable the reuse of the LO buffer 104. By way of example, but not limitation, the signal node 110 may be one terminal of a balun circuit that may be implemented by a transformer.

In this embodiment, the RX LO buffer 230 of one RX circuit 204 can be reused for loop-back test of another RX circuit 202 through the auxiliary path 206. Specifically, when the auxiliary path 206 is controlled to cut off a loop-back path, the RX LNA 224, down-converter mixer 226 and RX analog front-end circuit 228 of the RX circuit 204 are enabled, the RX LO buffer 230 is used for providing an LO signal to the down-converter mixer 226, the RX LNA 214, down-converter mixer 216, and RX analog front-end circuit 218 of the RX circuit 202 are enabled, and the RX LO buffer 220 is used for providing an LO signal to the down-converter mixer 216; when the auxiliary path 206 is controlled to enable the loop-back path, the RX LO buffer 230 is reused for loop-back test of the RX circuit 202, the RX LNA 224, down-converter mixer 226 and RX analog front-end circuit 228 of the RX circuit 204 may be disabled for saving power, the RX LNA 214, down-converter mixer 216 and RX analog front-end circuit 218 remain enabled, and the RX LO buffer 220 is used for providing an LO signal to the down-converter mixer 216. Since the existing RX LO buffer 230 is reused for loop-back test of the RX circuit 202, no additional testing tone generator (TTG) is required.

Figure 3:
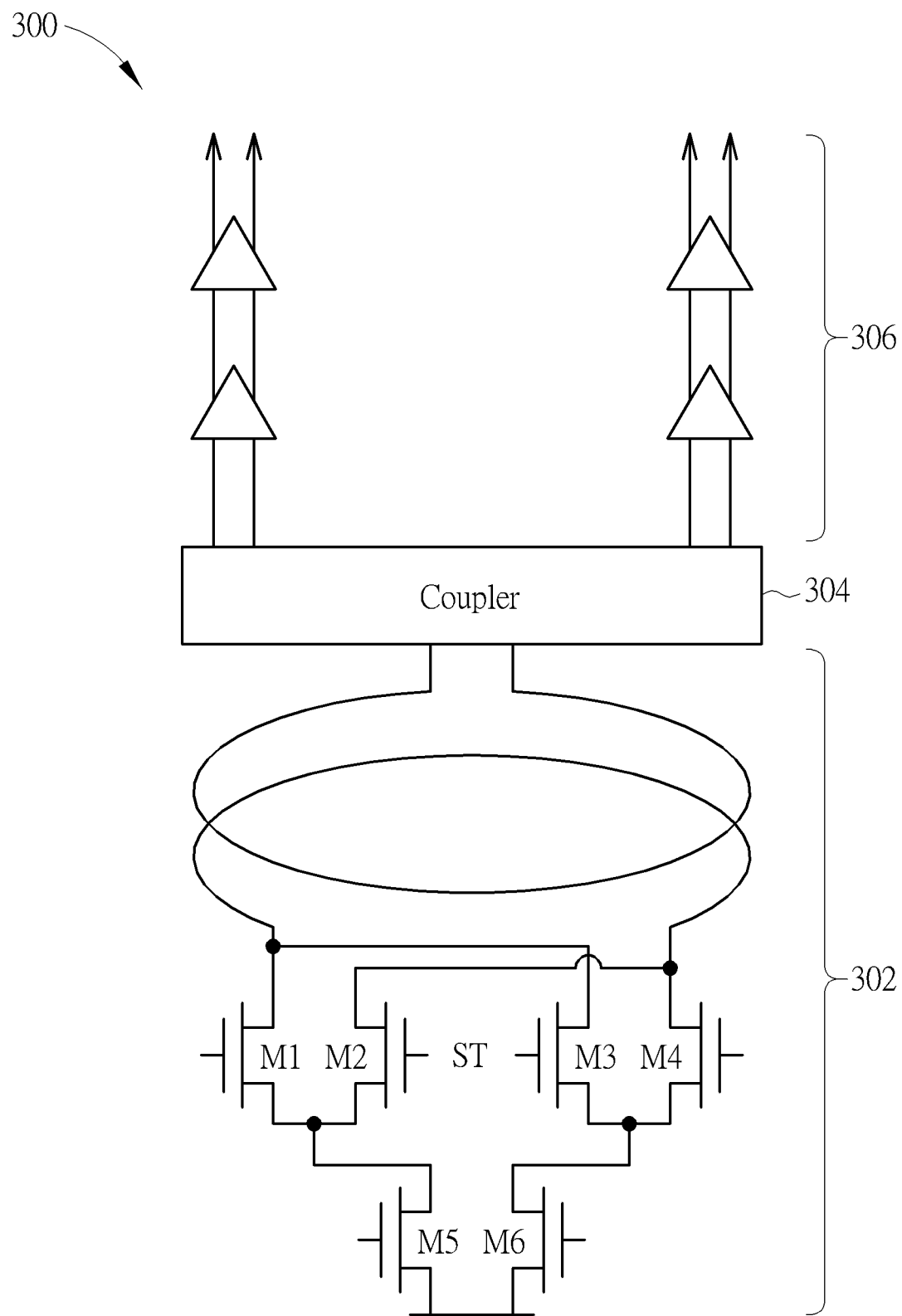
FIG. 3 is a diagram illustrating an LO buffer equipped with a mixer function according to an embodiment of the present invention.

In some embodiments of the present invention, the RX LO buffer 230 that can be reused for loop-back test may be equipped with a mixer function for generating and outputting an LO+IF (intermediate frequency) signal, or may be a typical LO buffer without a mixer function for generating and outputting an LO signal. FIG. 3 is a diagram illustrating an LO buffer equipped with a mixer function according to an embodiment of the present invention. The RX LO buffer 230 shown in FIG. 2 may be implemented using the LO buffer 300 shown in FIG. 3. The LO buffer 300 includes a first buffer stage 302, a coupler 304, and a second buffer stage 306. The first buffer stage 302 supports a mixer function for IF testing tone generation. As shown in FIG. 3, the first buffer stage 302 includes a plurality of transistors M1, M2, M3, M4, M5, M6. The transistors M2 and M3 can be used to receive an IF signal ST that is provided from, for example, a digital-to-analog converter (DAC) far away from the LO buffer 300. Suppose that a frequency of an LO signal generated from a local oscillator (not shown) and received by the first buffer stage 302 is 79 GHz. In a case where the RX LO buffer 230 is implemented by the LO buffer 300 and the transistors M2 and M3 are disabled by bias voltages, the signal looped backed to the RX signal path of the RX circuit 202 is a 79 GHz signal. If a frequency of the LO signal provided by the RX LO buffer 220 is also 79 GHz, a direct current (DC) term can be tested after mixing at the down-converter mixer 216. In another case where the RX LO buffer 230 is implemented by the LO buffer 300 and the transistors M2 and M3 are used to receive the IF signal ST (e.g., 2 MHz sine tone), the signal looped backed to the RX signal path of the RX circuit 202 is a 79 GHz+2 MHz signal. If a frequency of the LO signal provided by the RX LO buffer 220 is also 79 GHz, the RX total chain gain can be tested by the 2 MHz sine tone. However, these are for illustrative purposes only, and are not meant to be limitations of the present invention.

Figure 4:
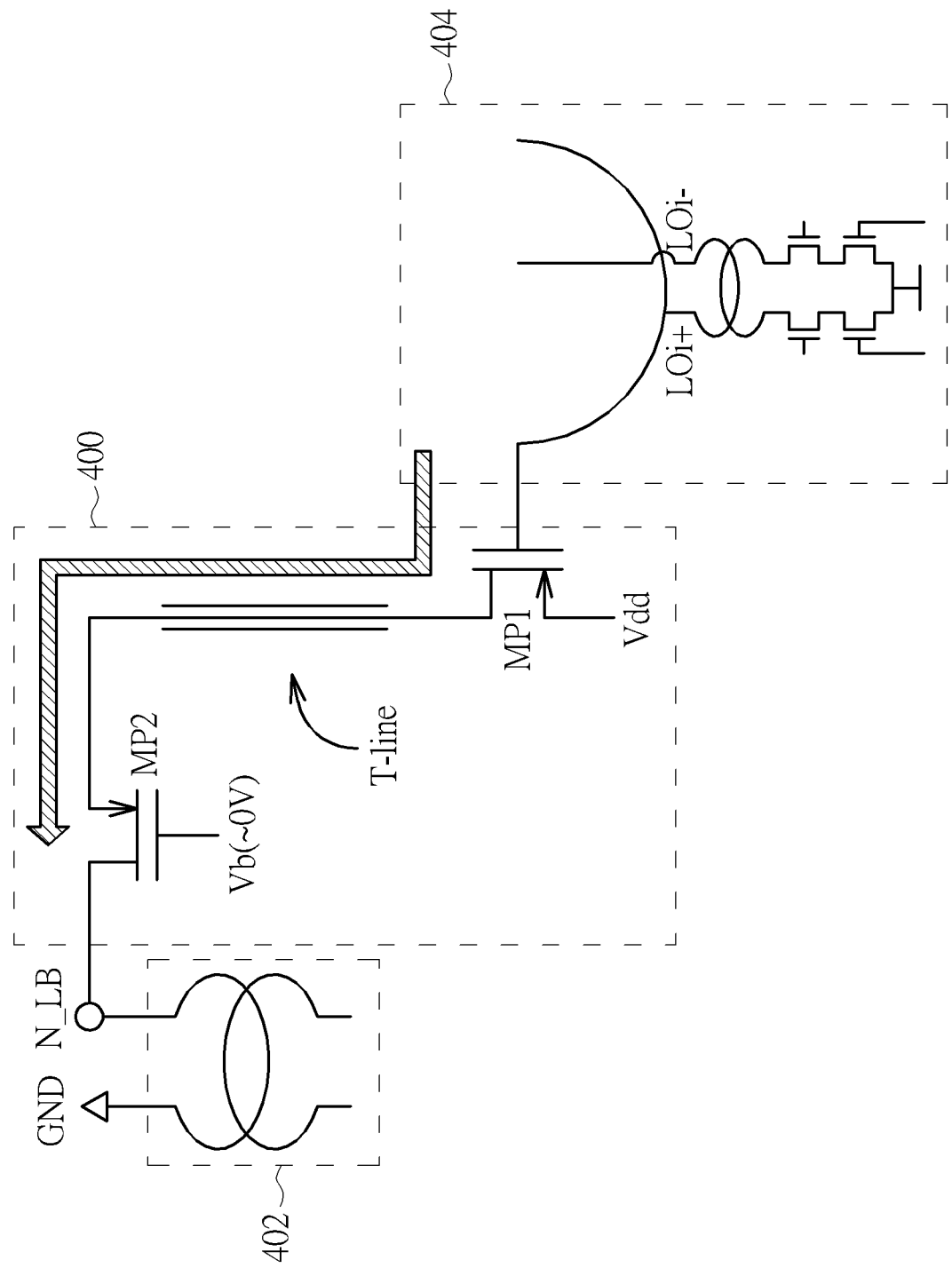
FIG. 4 is a circuit diagram illustrating an auxiliary path with a first configuration under a loop-back test mode according to an embodiment of the present invention.

As mentioned above, the auxiliary path 106 is arranged to electrically connect an output signal of the LO buffer 104 to the signal node 110 for allowing the LO buffer 104 to be reused for a different function (e.g., loop-back test or low-power transmission). By way of example, but not limitation, the auxiliary path 106 may be implemented by passive component (s) such as capacitor (s), active component (s) such as transistor (s), or a combination thereof. FIG. 4 is a circuit diagram illustrating an auxiliary path with a first configuration under a loop-back test mode according to an embodiment of the present invention. The auxiliary path 206 shown in FIG. 2 may be implemented by the auxiliary path 400, such that the RX LO buffer 230 of the RX circuit 204 can be reused for loop-back test of the RX circuit 202. As shown in FIG. 4, the auxiliary path 400 includes a buffer implemented by a P-type metal-oxide-semiconductor (PMOS) based amplifier, having two PMOS transistors MP1 and MP2. The balun circuit 212 shown in FIG. 2 may be implemented by the balun circuit 402, where one terminal on an unbalanced side of the balun circuit 402 is coupled to a ground voltage GND, and another terminal on the unbalanced side of the balun circuit 402 that is used to communicate with an antenna (e.g., antenna 201) acts as the signal node N_LB. In other words, the signal node N_LB is an ungrounded terminal on the unbalanced side of the balun circuit 402. The signal node N_LB may be coupled to the antenna (e.g., antenna 201) without via a transmit/receive (TR) switch, or may be coupled to the antenna (e.g., antenna 201) via a TR switch.

The RX LO buffer 230 may be implemented by the LO buffer 404, where a part of the LO buffer 404 is enabled to provide a loop-back test signal, while a remaining part of the LO buffer 404 may be disabled for saving power. Since the remaining part of the LO buffer 404 is disabled, it is not illustrated in FIG. 4 for brevity. More specifically, circuit components of the RX circuit 204, including RX LNA 224, down-converter mixer 226, RX AFE 228, etc., that are not involved in loop-back test of the RX circuit 202 may be disabled for saving power, and circuit components of the RX circuit 202, including RX LNA 214, down-converter mixer 216, RX AFE 218, etc., that are involved in loop-back test of the RX circuit 202 should remain enabled.

To reuse the RX LO buffer 230 for loop-back test, a source terminal of the PMOS transistor MP1 is coupled to a supply voltage Vdd, a gate terminal of the PMOS transistor MP1 is arranged to receive an LO signal (e.g., LOi+) from the LO buffer 404, a drain terminal of the PMOS transistor MP1 is coupled to a source terminal of the PMOS transistor MP2 through, for example, a surface wave transmission line T-line, a drain terminal of the PMOS transistor MP2 is coupled to the signal node N_LB (e.g., ungrounded terminal on the unbalanced side of the balun circuit 402), and a gate terminal of the PMOS transistor MP2 is coupled to a bias voltage Vb (~0V). It should be noted that the balun circuit 402 (more particularly, winding on the unbalanced side of the balun circuit 402) is reused as an output load of the PMOS based amplifier when the PMOS based amplifier is enabled to drive the signal node N_LB according to an output signal of the LO buffer 404. In other words, the PMOS based amplifier reuses the input balun matching as an amplifier load to act as a high-frequency amplifier.

Figure 5:
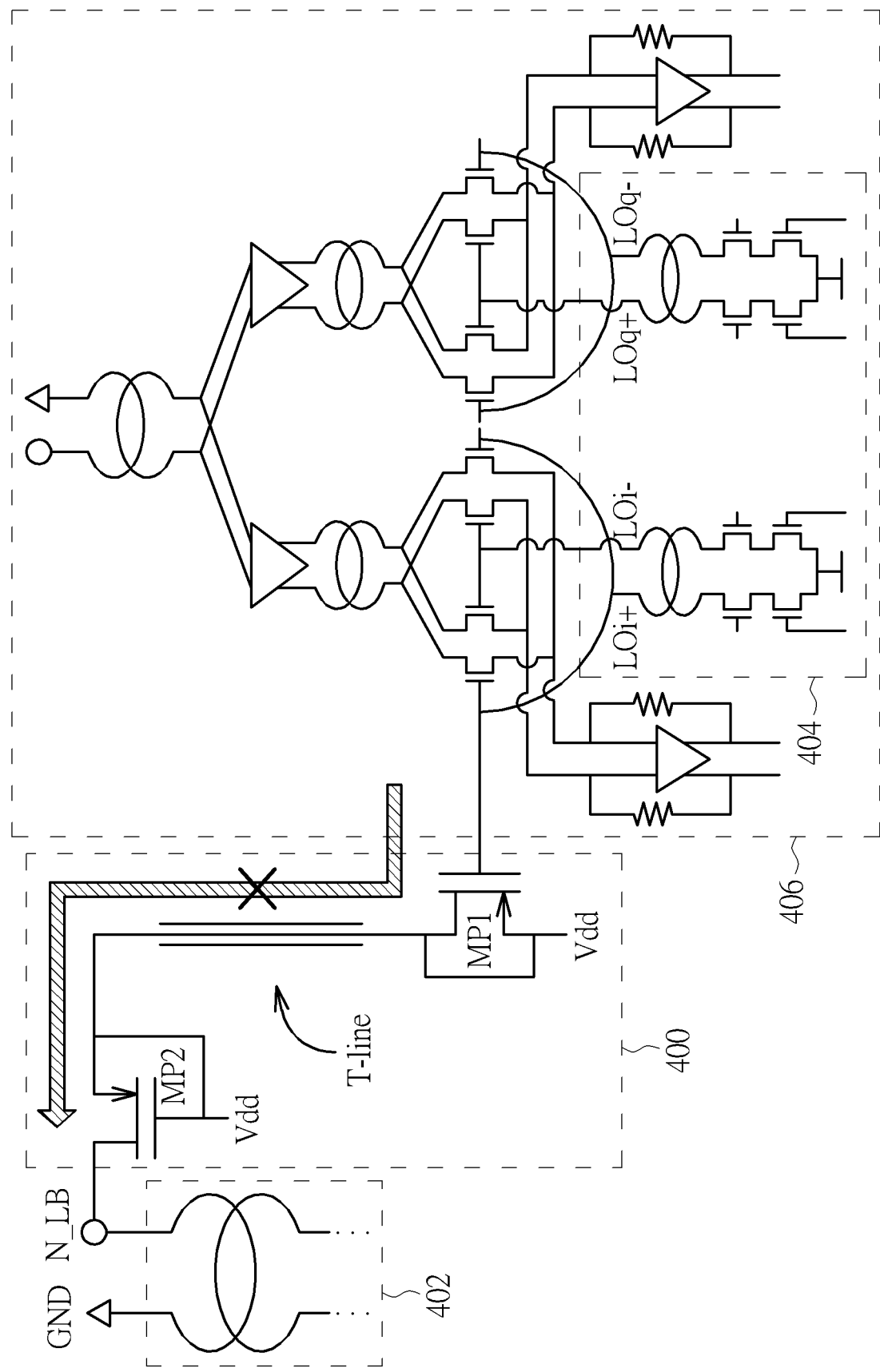
FIG. 5 is a circuit diagram illustrating an auxiliary path with a second configuration under a normal mode according to an embodiment of the present invention.

When the RX circuit 204 operates under a normal mode, the RX LO buffer 230 is required to provide an LO signal to the down-converter mixer 226. The auxiliary circuit 206 may be controlled to cut off the loop-back path between the RX circuits 202 and 204. FIG. 5 is a circuit diagram illustrating an auxiliary path with a second configuration under a normal mode according to an embodiment of the present invention. Considering a case where the auxiliary path 206 shown in FIG. 2 is implemented by the auxiliary path 400, a part of the RX circuit 204 may be implemented by the RX circuit 406, and the RX LO buffer 230 may be implemented by the LO buffer 404. The whole LO buffer 404 is enabled to provide an LO input {LOi+, LOi–, LOq+, LOq–} needed by the down-converter mixer consisting of an in-phase (I) mixer and a quadrature (Q) mixer. More specifically, circuit components of the RX circuit 204, including RX LNA 224, down-converter mixer 226, RX AFE 228, RX LO buffer 230, etc., that are involved in a normal RX operation of the RX circuit 204 should be enabled.

To cut off the loop-back path, the source terminal of the PMOS transistor MP1 is coupled to the supply voltage Vdd and the drain terminal of the PMOS transistor MP1, and the gate terminal of the PMOS transistor MP2 is coupled to the supply voltage Vdd and the source terminal of the PMOS transistor MP2. Hence, the PMOS transistor MP1 is configured as a MOS capacitor, and the PMOS transistor MP2 is turned off.

Figure 6:
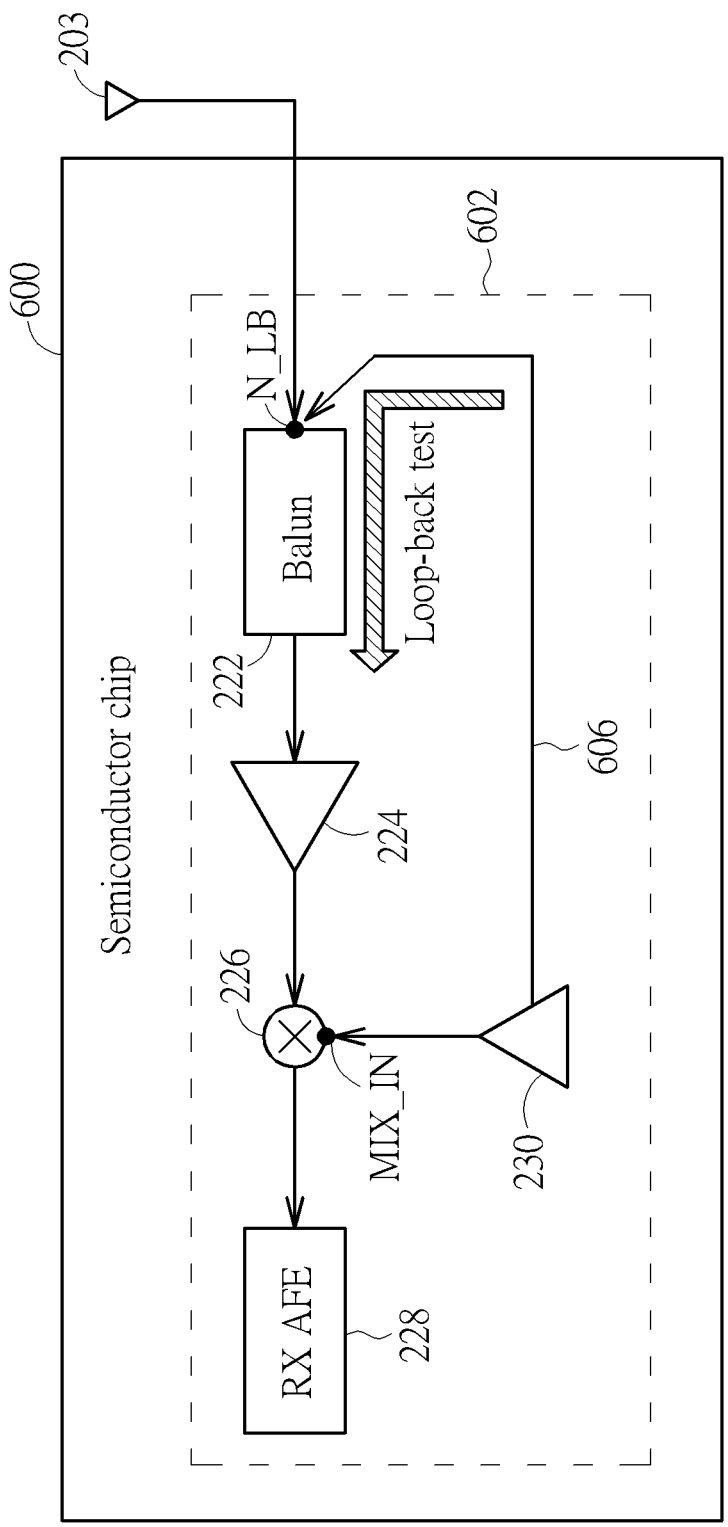
FIG. 6 is a diagram illustrating a second semiconductor chip with an LO buffer reused for loop-back test according to an embodiment of the present invention.

Regarding the embodiment shown in FIG. 2, an RX LO buffer of one RX circuit is reused for loop-back test of another RX circuit. However, this is for illustrative purposes only, and is not meant to be a limitation of the present invention. FIG. 6 is a diagram illustrating a second semiconductor chip with an LO buffer reused for loop-back test according to an embodiment of the present invention. The semiconductor chip 600 includes an RX circuit 602 that is coupled to the antenna 203 and belongs to a wireless communication system (e.g., RADAR system or non-RADAR system), and adopts the architecture shown in FIG. 1. For example, the wireless communication circuit 102 is realized by a part of the RX circuit 602; the signal path 108 is realized by an RX signal path including balun circuit 222, RX LNA 224, down-converter mixer 226 and RX analog front-end circuit 228, where the mixer input port 112 is realized by the mixer input port MIX_IN of the down-converter mixer 226, and the signal node 110 is realized by the signal node N_LB between balun circuit 222 and antenna 203; the LO buffer 104 is realized by the RX LO buffer 230 of the RX circuit 602; and the auxiliary path 106 is realized by an auxiliary path 606 coupled between the RX LO buffer 230 and the signal node N_LB. In this embodiment, the RX LO buffer 230 may be implemented by a typical LO buffer without a mixer function, and the auxiliary path 606 may be implemented by a PMOS based amplifier such as the auxiliary path 400 shown in FIGS. 4-5. Hence, the auxiliary path 606 may include a PMOS based amplifier coupled between the RX LO buffer 230 and an ungrounded terminal on an unbalanced side of the balun circuit 222.

For brevity, only one RX circuit is shown in FIG. 6. In practice, the semiconductor chip 600 may include multiple RX circuits and multiple TX circuits.

In this embodiment, the RX LO buffer 230 of RX circuit 602 can be reused for loop-back test of the same RX circuit 602 through the auxiliary path 606. Specifically, when the auxiliary path 606 is controlled to cut off a loop-back path, the RX LNA 224, down-converter mixer 226 and RX analog front-end circuit 228 of the RX circuit 602 are enabled, and the RX LO buffer 230 is used for providing an LO signal to the down-converter mixer 226; when the auxiliary path 606 is controlled to enable the loop-back path, the RX LNA 224, down-converter mixer 226 and RX analog front-end circuit 228 of the RX circuit 602 remain enabled, and RX LO buffer 230 is used for providing an LO signal to the down-converter mixer 226, and is also reused for loop-back test of the RX circuit 602 by providing an LO signal to the signal node N_LB. Since the existing RX LO buffer 230 is reused for loop-back test of the RX circuit 602, no additional testing tone generator (TTG) is required.

Figure 7:
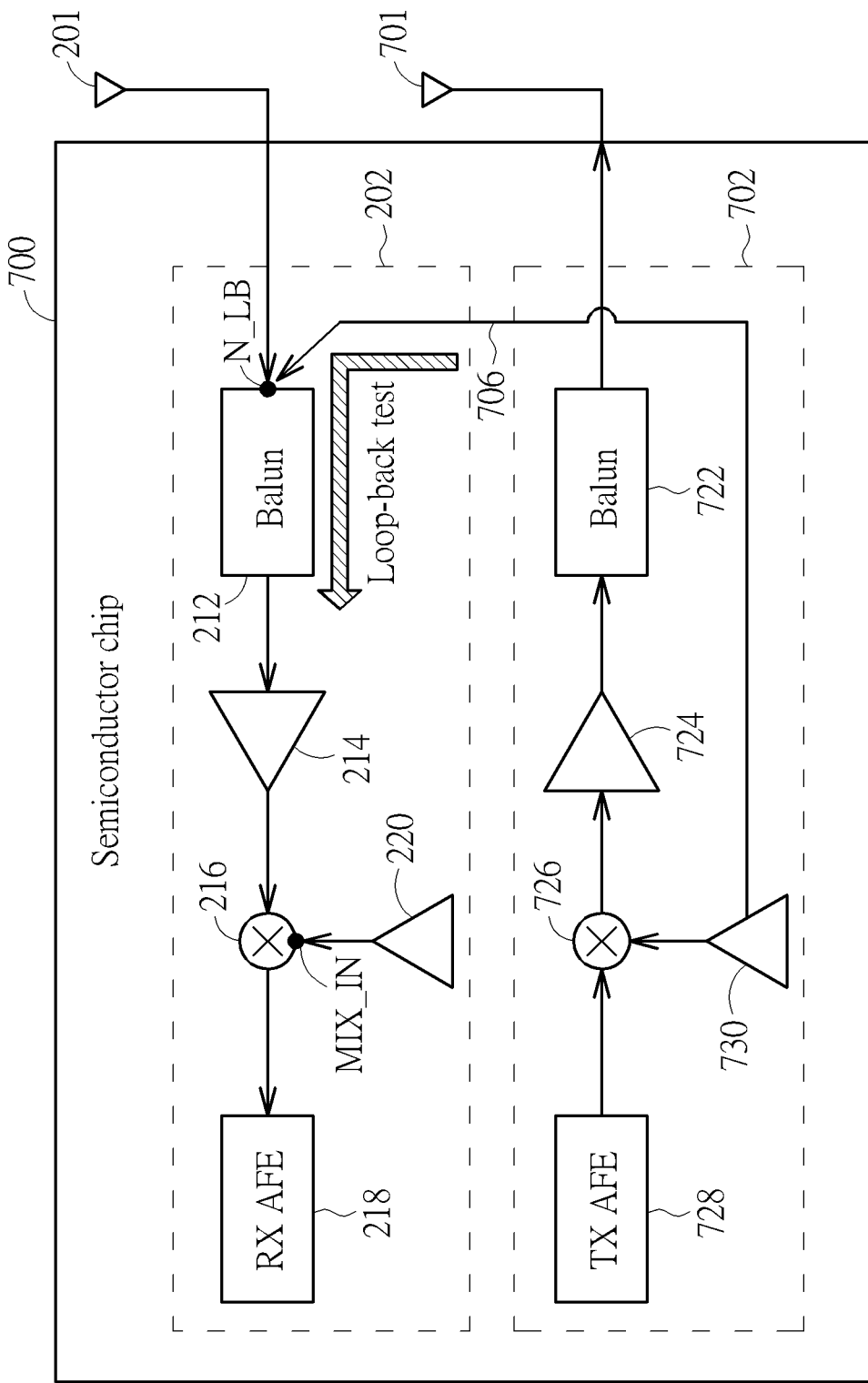
FIG. 7 is a diagram illustrating a third semiconductor chip with an LO buffer reused for loop-back test according to an embodiment of the present invention.

FIG. 7 is a diagram illustrating a third semiconductor chip with an LO buffer reused for loop-back test according to an embodiment of the present invention. The semiconductor chip 700 includes the TX circuit 702 and the RX circuit 202. For brevity, only one RX circuit and only one TX circuit are shown in FIG. 7. In practice, the semiconductor chip 700 may include multiple RX circuits and multiple TX circuits. The TX circuit 702 and the RX circuit 202 may belong to the same wireless communication system (e.g., RADAR system) or different wireless communication systems (e.g., one RADAR system and one non-RADAR system). The TX circuit 702 is coupled to an antenna (e. g., AiP or AoB) 701, and includes a balun circuit (labeled as "Balun") 722, a TX power amplifier (PA) circuit 724 (which may include one or more PA stages), an up-converter mixer 726, a TX analog front-end circuit (labeled as "TX AFE") 728, and a TX LO buffer 730. The semiconductor chip 700 adopts the architecture shown in FIG. 1. For example, the wireless communication circuit 102 is realized by a part of the RX circuit 202; the signal path 108 is realized by an RX signal path including balun circuit 212, RX LNA 214, down-converter mixer 216 and RX analog front-end circuit 218, where the mixer input port 112 is realized by the mixer input port MIX_IN of the down-converter mixer 216, and the signal node 110 is realized by the signal node N_LB between balun circuit 212 and antenna 201; the LO buffer 104 is realized by the TX LO buffer 730 of the TX circuit 702; and the auxiliary path 106 is realized by an auxiliary path 706 coupled between the TX LO buffer 730 and the signal node N_LB. The TX LO buffer 730 may be implemented by a typical LO buffer without a mixer function, or may be implemented by a proposed LO buffer with a mixer function such as the LO buffer 300 shown in FIG. 3. The auxiliary path 706 may be implemented by a PMOS based amplifier such as the auxiliary path 400 shown in FIGS. 4-5. Hence, the auxiliary path 706 may include a PMOS based amplifier coupled between the TX LO buffer 730 and an ungrounded terminal on an unbalanced side of the balun circuit 212.

In this embodiment, the TX LO buffer 730 of the TX circuit 702 can be reused for loop-back test of the RX circuit 202 through the auxiliary path 706. Specifically, when the auxiliary path 706 is controlled to cut off a loop-back path, the RX LNA 214, down-converter mixer 216 and RX analog front-end circuit 218 of the RX circuit 202 are enabled, the RX LO buffer 220 is used for providing an LO signal to the down-converter mixer 216, the TX PA circuit 724, up-converter mixer 726 and TX analog front-end circuit 728 are enabled, and the TX LO buffer 730 is used for providing an LO signal to the up-converter mixer 726; when the auxiliary path 706 is controlled to enable the loop-back path, the TX LO buffer 730 is reused for loop-back test of the RX circuit 202, the TX PA circuit 724, up-converter mixer 726 and TX analog front-end circuit 728 of the TX circuit 702 may be disabled for saving power, and the RX LNA 214, down-converter mixer 216 and RX analog front-end circuit 218 of the RX circuit 202 may be disabled for saving power. Since the existing TX LO buffer 730 is reused for loop-back test of the RX circuit 202, no additional testing tone generator (TTG) is required.

In above embodiments, an LO buffer (e.g., RX LO buffer or TX LO buffer) is reused for a loop-back test function. In practice, reusing the LO buffer for a function different from the loop-back function is feasible. Compared to a normal TX chain, an LO buffer may be regarded as a low-power transmitter for generating and outputting an RF signal with the LO frequency. Hence, the same concept of reusing an LO buffer (e.g., RX LO buffer or TX LO buffer) may be applicable to a low-power TX application. For example, the low-power TX application employing the proposed design of reusing the LO buffer may be a low-power scan mode (or low-power short distance scan mode) of a frequency modulated continuous waveform (FMCW) RADAR system. For another example, an auxiliary path may be used for a loop-back function, and may be reused for a low-power TX function.

Figure 8:
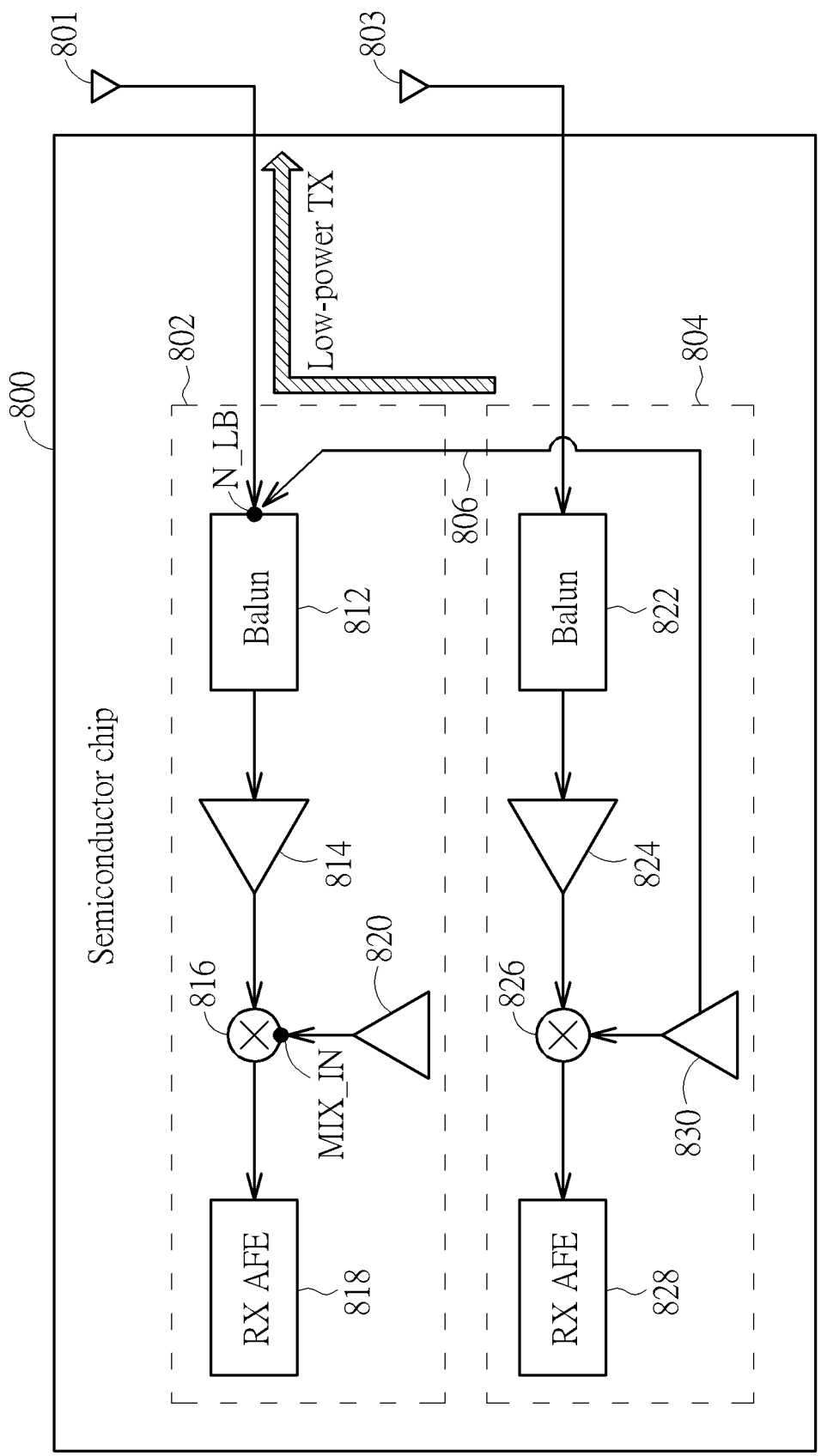
FIG. 8 is a diagram illustrating a first semiconductor chip with an LO buffer reused for TX mode according to an embodiment of the present invention.

FIG. 8 is a diagram illustrating a first semiconductor chip with an LO buffer reused for TX mode according to an embodiment of the present invention. The semiconductor chip 800 includes two RX circuits 802 and 804. For brevity, only two RX circuits are shown in FIG. 8. In practice, the semiconductor chip 800 may include multiple RX circuits and multiple TX circuits. The RX circuits 802 and 804 may be adjacent to each other in the semiconductor chip 800, but the present invention is not limited thereto. The RX circuits 802 and 804 may belong to the same wireless communication system (e.g., RADAR system) or different wireless communication systems (e.g., one RADAR system and one non-RADAR system). The RX circuit 802 is coupled to an antenna (e.g., AiP or AoB) 801, and includes a balun circuit (labeled as "Balun") 812, an RX LNA 814, a down-converter mixer 816, an RX analog front-end circuit (labeled as "RX AFE") 818, and an RX LO buffer 820. The RX circuit 804 is coupled to an antenna (e.g., AiP or AoB) 803, and includes a balun circuit (labeled as "Balun") 822, an RX LNA 824, a down-converter mixer 826, an RX analog front-end circuit (labeled as "RX AFE") 828, and an RX LO buffer 830. The semiconductor chip 800 adopts the architecture shown in FIG. 1. For example, the wireless communication circuit 102 is realized by a part of the RX circuit 802; the signal path 108 is realized by an RX signal path including balun circuit 812, RX LNA 814, down-converter mixer 816 and RX analog front-end circuit 818, where the mixer input port 112 is realized by a mixer input port MIX_IN of the down-converter mixer 816, and the signal node 110 is realized by a signal node N_LB between balun circuit 812 and antenna 801; the LO buffer 104 is realized by the RX LO buffer 830 of the RX circuit 804; and the auxiliary path 106 is realized by an auxiliary path 806 coupled between the RX LO buffer 830 and the signal node N_LB. The RX LO buffer 730 may be implemented by a proposed LO buffer with a mixer function such as the LO buffer 300 shown in FIG. 3. The auxiliary path 806 may be implemented by a PMOS based amplifier such as the auxiliary path 400 shown in FIGS. 4-5. Hence, the auxiliary path 806 may include a PMOS based amplifier coupled between the RX LO buffer 830 and an ungrounded terminal on an unbalanced side of the balun circuit 812.

In this embodiment, the RX LO buffer 830 of RX circuit 804 can be reused for TX mode through the auxiliary path 806 and the antenna 801. Specifically, when the auxiliary path 806 is controlled to cut off a TX path, the RX LNA 824, down-converter mixer 826 and RX analog front-end circuit 828 of the RX circuit 804 are enabled, the RX LO buffer 830 is used for providing an LO signal to the down-converter mixer 826, the RX LNA 814, down-converter mixer 816 and RX analog front-end circuit 818 of the RX circuit 802 are enabled, and the RX LO buffer 820 is used for providing an LO signal to the down-converter mixer 816; when the auxiliary path 806 is controlled to enable the TX path, the RX LO buffer 830 is reused for TX mode, the RX LNA 814, down-converter mixer 816 and RX analog front-end circuit 818 of the RX circuit 802 may be disabled for saving power, and the RX LNA 824, down-converter mixer 826 and RX analog front-end circuit 828 of the RX circuit 804 may be disabled for saving power. This makes this scheme especially suitable for low-power TX applications since a lot of circuits can be disabled to keep power consumption low. The antenna 801 is reused by the low-power TX function for transmitting an output signal (e.g., signal with (LO+IF) frequency) generated from the RX LO buffer 830, that is, an RF signal generated from a low-power transmitter. In some embodiments, when the antenna 801 is reused by the low-power TX function, a TR switch may be integrated in the RX input of the RX circuit 802 to increase the off-mode RX impedance for raising the TX power.

Figure 9:
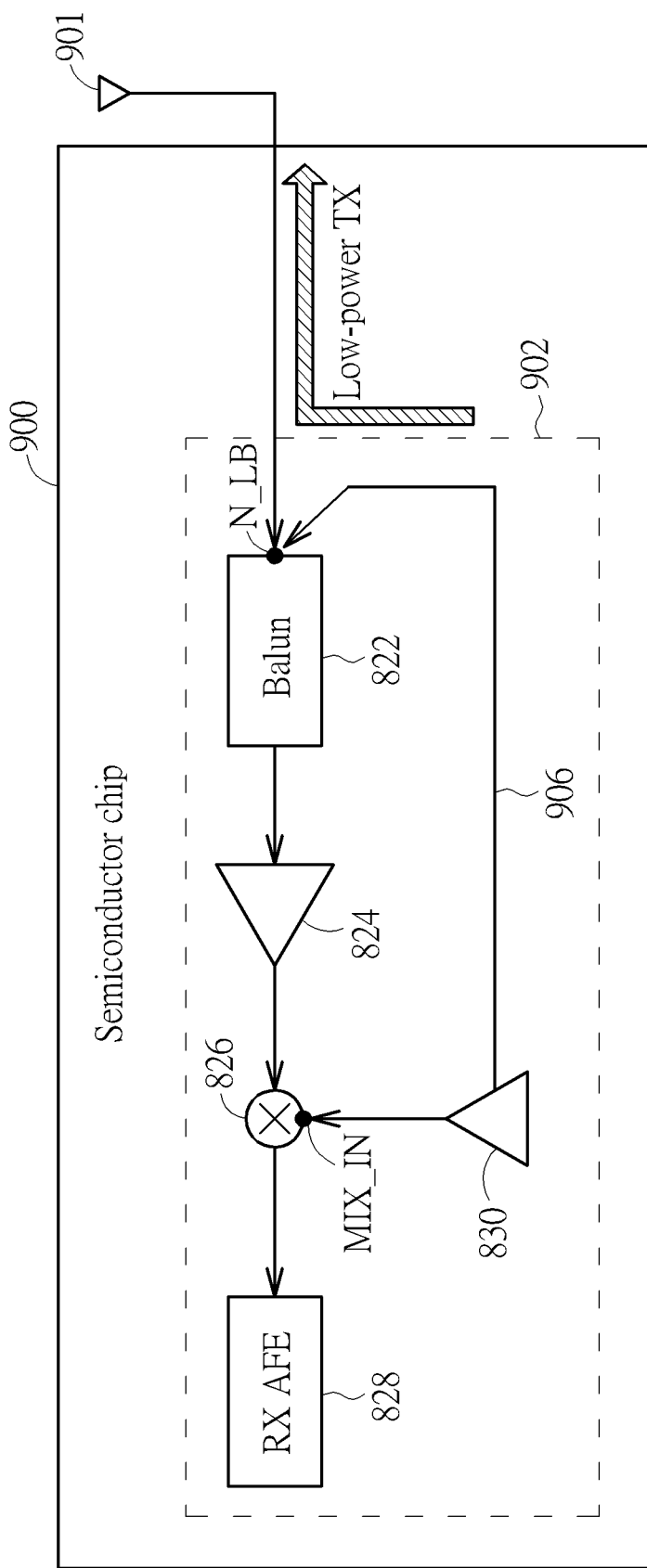
FIG. 9 is a diagram illustrating a second semiconductor chip with an LO buffer reused for TX mode according to an embodiment of the present invention.

FIG. 9 is a diagram illustrating a second semiconductor chip with an LO buffer reused for TX mode according to an embodiment of the present invention. The semiconductor chip 900 includes an RX circuit 902 that is coupled to an antenna (e.g., AiP or AoB) 901 and belongs to a wireless communication system (e.g., RADAR system or non-RADAR system). For brevity, only one RX circuit is shown in FIG. 9. In practice, the semiconductor chip 900 may include multiple RX circuits and multiple TX circuits. The semiconductor chip 900 adopts the architecture shown in FIG. 1. For example, the wireless communication circuit 102 is realized by a part of the RX circuit 902; the signal path 108 is realized by an RX signal path including balun circuit 822, RX LNA 824, down-converter mixer 826 and RX analog front-end circuit 828, where the mixer input port 112 is realized by the mixer input port MIX_IN of the down-converter mixer 826, and the signal node 110 is realized by the signal node N_LB between balun circuit 822 and antenna 901; the LO buffer 104 is realized by the RX LO buffer 830 of the RX circuit 804; and the auxiliary path 106 is realized by an auxiliary path 906 coupled between the RX LO buffer 830 and the signal node N_LB. The RX LO buffer 830 may be implemented by a proposed LO buffer with a mixer function such as the LO buffer 300 shown in FIG. 3. The auxiliary path 906 may be implemented by a PMOS based amplifier such as the auxiliary path 400 shown in FIGS. 4-5. Hence, the auxiliary path 906 may include a PMOS based amplifier coupled between the RX LO buffer 830 and an ungrounded terminal on an unbalanced side of the balun circuit 822.

In this embodiment, the RX LO buffer 830 of RX circuit 804 can be reused for TX mode through the auxiliary path 906 and the antenna 901. Specifically, when the auxiliary path 906 is controlled to cut off a TX path, the RX LNA 824, down-converter mixer 826 and RX analog front-end circuit 828 of the RX circuit 902 are enabled, and the RX LO buffer 830 is used for providing an LO signal to the down-converter mixer 826; when the auxiliary path 906 is controlled to enable the TX path, the RX LO buffer 830 is reused for TX mode, and the RX LNA 824, down-converter mixer 826 and RX analog front-end circuit 828 of the RX circuit 902 may be disabled for saving power. This makes this scheme especially suitable for low-power TX applications since a lot of circuits can be disabled to keep power consumption low. The antenna 901 is reused by the low-power TX function for transmitting an output signal (e.g., signal with (LO+IF) frequency) generated from the RX LO buffer 830, that is, an RF signal generated from a low-power transmitter. In some embodiments, when the antenna 901 is reused by the low-power TX function, a TR switch may be integrated in the RX input of the RX circuit 902 to increase the off-mode RX impedance for raising the TX power.

Figure 10:
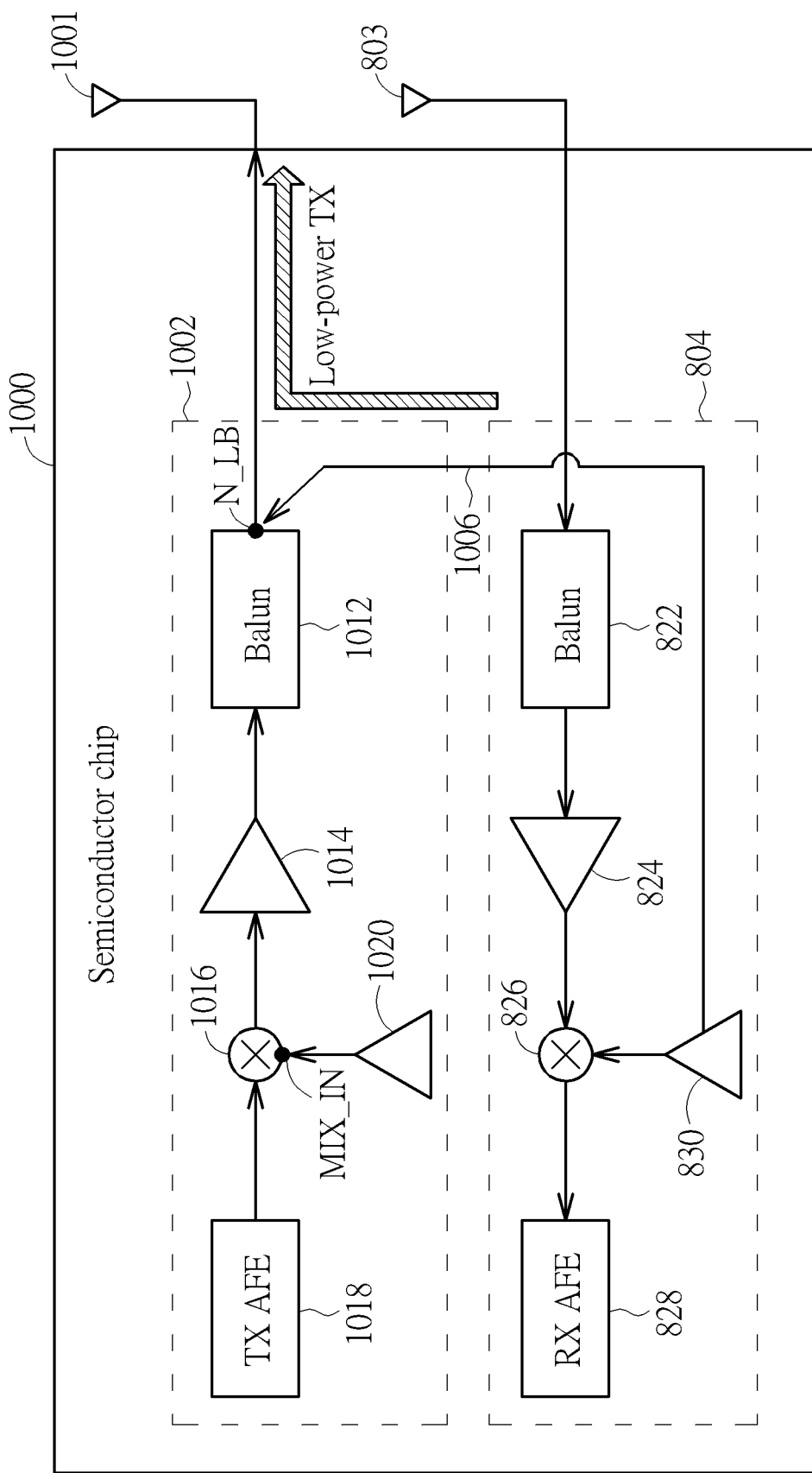
FIG. 10 is a diagram illustrating a third semiconductor chip with an LO buffer reused for TX mode according to an embodiment of the present invention.

FIG. 10 is a diagram illustrating a third semiconductor chip with an LO buffer reused for TX mode according to an embodiment of the present invention. The semiconductor chip 1000 includes a TX circuit 1002 and an RX circuit 804. For brevity, only one RX circuit and only one TX circuit are shown in FIG. 10. In practice, the semiconductor chip 1000 may include multiple RX circuits and multiple TX circuits. The TX circuit 1002 and the RX circuit 804 may belong to the same wireless communication system (e.g., RADAR system) or different wireless communication systems (e.g., one RADAR system and one non-RADAR system). The TX circuit 1002 is coupled to an antenna (e.g., AiP or AoB) 1001, and includes a balun circuit (labeled as "Balun") 1012, a TX PA circuit 1014 (which may include one or more PA stages), an up-converter mixer 1016, a TX analog front-end circuit (labeled as "TX AFE") 1018, and a TX LO buffer 1020. The semiconductor chip 1000 adopts the architecture shown in FIG. 1. For example, the wireless communication circuit 102 is realized by a part of the TX circuit 1002; the signal path 108 is realized by a TX signal path including balun circuit 1012, TX PA circuit 1014, up-converter mixer 1016 and TX analog front-end circuit 1018, where the mixer input port 112 is realized by a mixer input port MIX_IN of the up-converter mixer 1016, and the signal node 110 is realized by a signal node N_LB between balun circuit 1012 and antenna 1001; the LO buffer 104 is realized by the RX LO buffer 830 of the RX circuit 804; and the auxiliary path 106 is realized by an auxiliary path 1006 coupled between the RX LO buffer 830 and the signal node N_LB. The RX LO buffer 830 may be implemented by a proposed LO buffer with a mixer function such as the LO buffer 300 shown in FIG. 3. The auxiliary path 1006 may be implemented by a PMOS based amplifier such as the auxiliary path 400 shown in FIGS. 4-5. Hence, the auxiliary path 1006 may include a PMOS based amplifier coupled between the RX LO buffer 830 and an ungrounded terminal on an unbalanced side of the balun circuit 1012.

In this embodiment, the RX LO buffer 830 of RX circuit 804 can be reused for TX mode through the auxiliary path 1006 and the antenna 1001. Specifically, when the auxiliary path 1006 is controlled to cut off a TX path, the RX LNA 824, down-converter mixer 826 and RX analog front-end circuit 828 of the RX circuit 804 are enabled, the RX LO buffer 830 is used for providing an LO signal to the down-converter mixer 826, the TX PA circuit 1014, up-converter mixer 1016 and TX analog front-end circuit 1018 of the TX circuit 1002 are enabled, and the TX LO buffer 1020 is used for providing an LO signal to the up-converter mixer 1016; when the auxiliary path 1006 is controlled to enable the TX path, the RX LO buffer 830 is reused for TX mode, the TX PA circuit 1014, up-converter mixer 1016 and TX analog front-end circuit 1018 of the TX circuit 1002 may be disabled for saving power, and the RX LNA 824, down-converter mixer 826 and RX analog front-end circuit 828 of the RX circuit 804 may be disabled for saving power. This makes this scheme especially suitable for low-power TX applications since a lot of circuits can be disabled to keep power consumption low. The antenna 1001 is reused by the low-power TX function for transmitting an output signal (e.g., signal with (LO+IF) frequency) generated from the RX LO buffer 830, that is, an RF signal generated from a low-power transmitter. In some embodiments, when the antenna 1001 is reused by the low-power TX function, a TR switch may be integrated in the TX output of the TX circuit 1002 to increase the off-mode TX impedance for raising the TX power.

Figure 11:
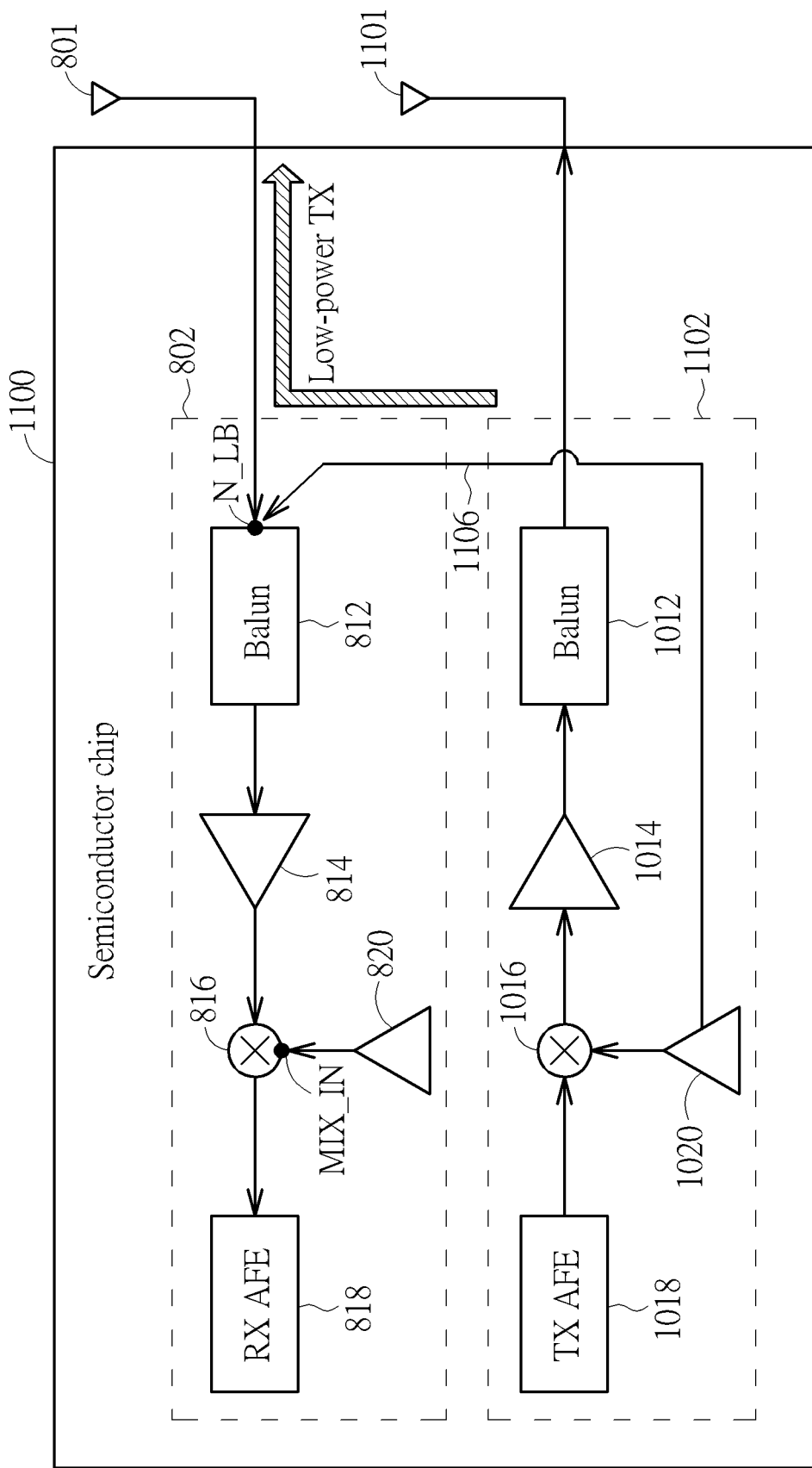
FIG. 11 is a diagram illustrating a fourth semiconductor chip with an LO buffer reused for TX mode according to an embodiment of the present invention.

FIG. 11 is a diagram illustrating a fourth semiconductor chip with an LO buffer reused for TX mode according to an embodiment of the present invention. The semiconductor chip 1100 includes then RX circuit 802 coupled to the antenna 801 and the TX circuit 1102 coupled to the antenna 1101. For brevity, only one RX circuit and only one TX circuit are shown in FIG. 11. In practice, the semiconductor chip 1100 may include multiple RX circuits and multiple TX circuits. The RX circuit 802 and the TX circuit 1102 may belong to the same wireless communication system (e.g., RADAR system) or different wireless communication systems (one RADAR system and one non-RADAR system). The semiconductor chip 1100 adopts the architecture shown in FIG. 1. For example, the wireless communication circuit 102 is realized by a part of the RX circuit 802; the signal path 108 is realized by an RX signal path including balun circuit 812, RX LNA 814, down-converter mixer 816 and RX analog front-end circuit 818, where the mixer input port 112 is realized by the mixer input port MIX_IN of the down-converter mixer 816, and the signal node 110 is realized by the signal node N_LB between balun circuit 812 and antenna 801; the LO buffer 104 is realized by the TX LO buffer 1020 of the TX circuit 1102; and the auxiliary path 106 is realized by an auxiliary path 1106 coupled between the TX LO buffer 1020 and the signal node N_LB. The TX LO buffer 1020 may be implemented by a proposed LO buffer with a mixer function such as the LO buffer 300 shown in FIG. 3. The auxiliary path 1106 may be implemented by a PMOS based amplifier such as the auxiliary path 400 shown in FIGS. 4-5. Hence, the auxiliary path 1106 may include a PMOS based amplifier coupled between the TX LO buffer 1020 and an ungrounded terminal on an unbalanced side of the balun circuit 812.

In this embodiment, the TX LO buffer 1020 of TX circuit 1102 can be reused for TX mode through the auxiliary path 1106 and the antenna 801. Specifically, when the auxiliary path 1106 is controlled to cut off a TX path, the RX LNA 814, down-converter mixer 816 and RX analog front-end circuit 818 of the RX circuit 802 are enabled, the RX LO buffer 820 is used for providing an LO signal to the down-converter mixer 816, the TX PA circuit 1014, up-converter mixer 1016 and TX analog front-end circuit 1018 of the TX circuit 1102 are enabled, and the TX LO buffer 1020 is used for providing an LO signal to the up-converter mixer 1016; when the auxiliary path 1106 is controlled to enable the TX path, the TX LO buffer 1020 is reused for TX mode, the RX LNA 814, down-converter mixer 816 and RX analog front-end circuit 818 of the RX circuit 802 may be disabled for saving power, and the TX PA circuit 1014, up-converter mixer 1016 and TX analog front-end circuit 1018 of the TX circuit 1102 may be disabled for saving power. This makes this scheme especially suitable for low-power TX applications since a lot of circuits can be disabled to keep power consumption low. The antenna 801 is reused by the low-power TX function for transmitting an output signal (e.g., signal with (LO+IF) frequency) generated from the TX LO buffer 1020, that is, an RF signal generated from a low-power transmitter. In some embodiments, when the antenna 801 is reused by the low-power TX function, a TR switch may be integrated in the RX input of the RX circuit 802 to increase the off-mode RX impedance for raising the TX power.

Figure 12:
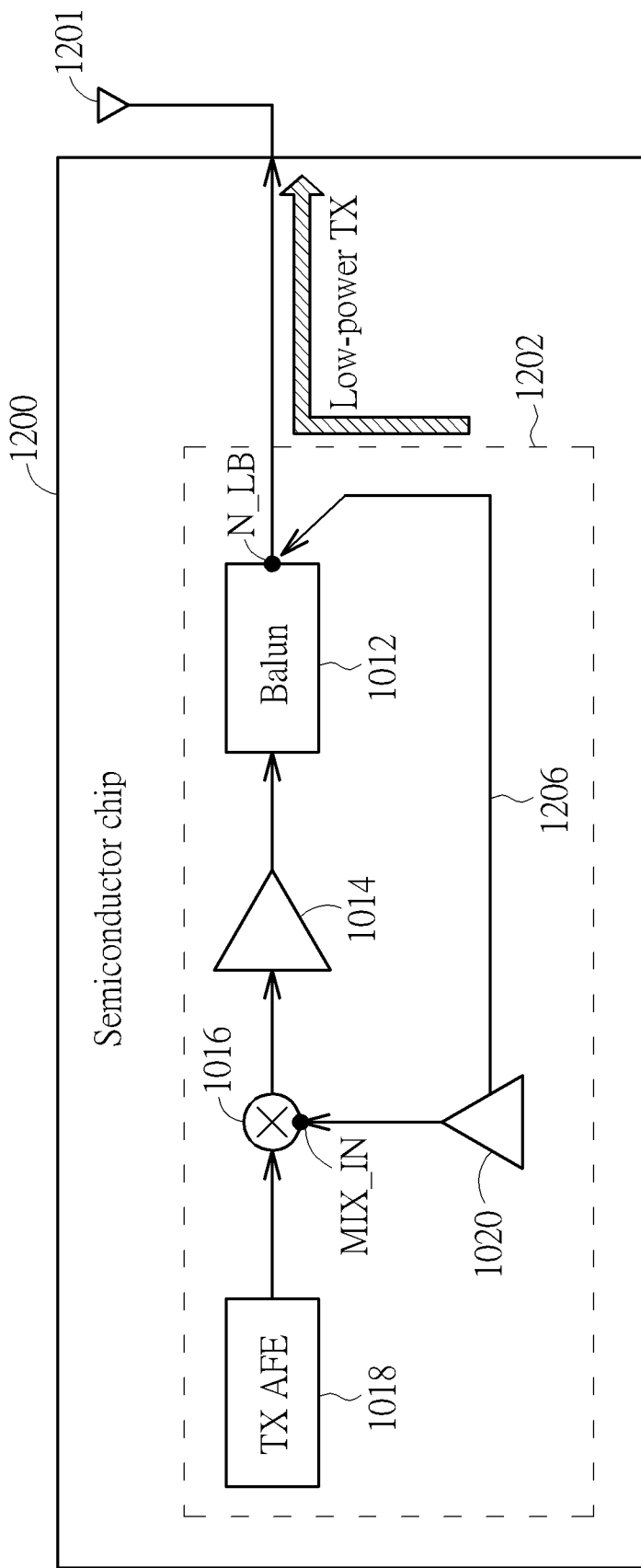
FIG. 12 is a diagram illustrating a fifth semiconductor chip with an LO buffer reused for TX mode according to an embodiment of the present invention.

FIG. 12 is a diagram illustrating a fifth semiconductor chip with an LO buffer reused for TX mode according to an embodiment of the present invention. The semiconductor chip 1200 includes a TX circuit 1202 that is coupled to an antenna (e.g., AiP or AoB) 1201 and belongs to a wireless communication system (e.g., RADAR system or non-RADAR system). For brevity, only one TX circuit is shown in FIG. 12. In practice, the semiconductor chip 1200 may include multiple RX circuits and multiple TX circuits. The semiconductor chip 1200 adopts the architecture shown in FIG. 1. For example, the wireless communication circuit 102 is realized by a part of the TX circuit 1202; the signal path 108 is realized by a TX signal path including balun circuit 1012, TX PA circuit 1014, up-converter mixer 1016 and TX analog front-end circuit 1018, where the mixer input port 112 is realized by a mixer input port MIX_IN of the up-converter mixer 1016, and the signal node 110 is realized by the signal node N_LB between balun circuit 1012 and antenna 1201; the LO buffer 104 is realized by the TX LO buffer 1020 of the TX circuit 1202; and the auxiliary path 106 is realized by an auxiliary path 1206 coupled between the TX LO buffer 1020 and the signal node N_LB. The TX LO buffer 1020 may be implemented by a proposed LO buffer with a mixer function such as the LO buffer 300 shown in FIG. 3. The auxiliary path 1206 may be implemented by a PMOS based amplifier such as the auxiliary path 400 shown in FIGS. 4-5. Hence, the auxiliary path 1206 may include a PMOS based amplifier coupled between the TX LO buffer 1020 and an ungrounded terminal on an unbalanced side of the balun circuit 1012.

In this embodiment, the TX LO buffer 1020 of TX circuit 1202 can be reused for TX mode through the auxiliary path 1206 and the antenna 1201. Specifically, when the auxiliary path 1206 is controlled to cut off a TX path, the TX PA circuit 1014, up-converter mixer 1016 and TX analog front-end circuit 1018 of the TX circuit 1202 are enabled, and the TX LO buffer 1020 is used for providing an LO signal to the up-converter mixer 1016; when the auxiliary path 1206 is controlled to enable the TX path, the TX LO buffer 1020 is reused for TX mode, and the TX PA circuit 1014, up-converter mixer 1016 and TX analog front-end circuit 1018 of the TX circuit 1202 may be disabled for saving power. This makes this scheme especially suitable for low-power TX applications since a lot of circuits can be disabled to keep power consumption low. The antenna 1201 is reused by the low-power TX function for transmitting an output signal (e.g., signal with (LO+IF) frequency) generated from the TX LO buffer 1020, that is, an RF signal generated from a low-power transmitter. In some embodiments, when the antenna 1201 is reused by the low-power TX function, a TR switch may be integrated in the TX output of the TX circuit 1202 to increase the off-mode TX impedance for raising the TX power.

Figure 13:
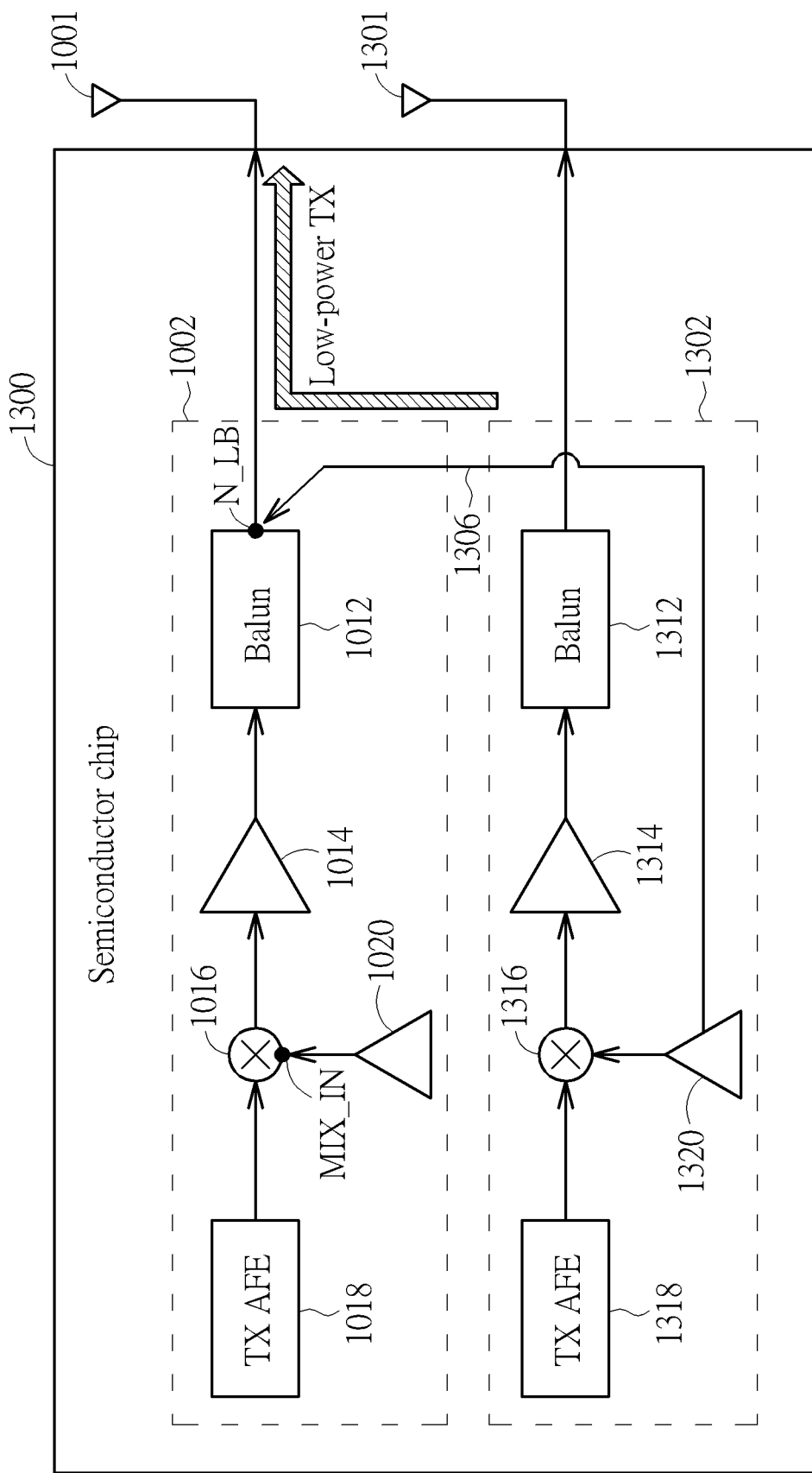
FIG. 13 is a diagram illustrating a sixth semiconductor chip with an LO buffer reused for TX mode according to an embodiment of the present invention.

FIG. 13 is a diagram illustrating a sixth semiconductor chip with an LO buffer reused for TX mode according to an embodiment of the present invention. The semiconductor chip 1300 includes two TX circuits 1002 and 1302. For brevity, only two TX circuits are shown in FIG. 13. In practice, the semiconductor chip 1300 may include multiple RX circuits and multiple TX circuits. The TX circuits 1002 and 1302 may belong to the same wireless communication system (e.g., RADAR system) or different wireless communication systems (e.g., one RADAR system and one non-RADAR system). The TX circuits 1002 and 1302 may be adjacent to each other in the semiconductor chip 1300, but the present invention is not limited thereto. The TX circuit 1302 is coupled to an antenna (e.g., AiP or AoB) 1301, and includes a balun circuit (labeled as "Balun") 1312, a TX PA circuit 1314 (which may include one or more PA stages), an up-converter mixer 1316, a TX analog front-end circuit (labeled as "TX AFE") 1318, and a TX LO buffer 1320. The semiconductor chip 1300 adopts the architecture shown in FIG. 1. For example, the wireless communication circuit 102 is realized by a part of the TX circuit 1002; the signal path 108 is realized by a TX signal path including balun circuit 1012, TX PA circuit 1014, up-converter mixer 1016 and TX analog front-end circuit 1018, where the mixer input port 112 is realized by the mixer input port MIX_IN of the up-converter mixer 1016, and the signal node 110 is realized by the signal node N_LB between balun circuit 1012 and antenna 1001; the LO buffer 104 is realized by the TX LO buffer 1320 of the TX circuit 1302; and the auxiliary path 106 is realized by an auxiliary path 1306 coupled between the TX LO buffer 1320 and the signal node N_LB. The TX LO buffer 1320 may be implemented by a proposed LO buffer with a mixer function such as the LO buffer 300 shown in FIG. 3. The auxiliary path 1306 may be implemented by a PMOS based amplifier such as the auxiliary path 400 shown in FIGS. 4-5. Hence, the auxiliary path 1306 may include a PMOS based amplifier coupled between the TX LO buffer 1320 and an ungrounded terminal on an unbalanced side of the balun circuit 1012.

In this embodiment, the TX LO buffer 1320 of TX circuit 1302 can be reused for TX mode through the auxiliary path 1306 and the antenna 1001. Specifically, when the auxiliary path 1306 is controlled to cut off a TX path, the TX PA circuit 1014, up-converter mixer 1016 and TX analog front-end circuit 1018 of the TX circuit 1002 are enabled, the TX LO buffer 1020 is used for providing an LO signal to the up-converter mixer 1016, the TX PA circuit 1314, up-converter mixer 1316 and TX analog front-end circuit 1318 of the TX circuit 1302 are enabled, and the TX LO buffer 1320 is used for providing an LO signal to the up-converter mixer 1316; when the auxiliary path 1306 is controlled to enable the TX path, the TX LO buffer 1320 is reused for TX mode, the TX PA circuit 1314, up-converter mixer 1316 and TX analog front-end circuit 1318 of the TX circuit 1302 may be disabled for saving power, and the TX PA circuit 1014, up-converter mixer 1016 and TX analog front-end circuit 1018 of the TX circuit 1002 may be disabled for saving power. This makes this scheme especially suitable for low-power TX applications since a lot of circuits can be disabled to keep power consumption low. The antenna 1001 is reused by the low-power TX function for transmitting an output signal (e.g., signal with (LO+IF) frequency) generated from the TX LO buffer 1320, that is, an RF signal generated from a low-power transmitter. In some embodiments, when the antenna 1001 is reused by the low-power TX function, a TR switch may be integrated in the TX output of the TX circuit 1002 to increase the off-mode TX impedance for raising the TX power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip comprising:
    a first wireless communication circuit, comprising a signal path, wherein the signal path comprises a mixer input port and a signal node distinct from the mixer input port;
    a local oscillator (LO) buffer, arranged to receive and buffer an LO signal; and
    an auxiliary path, arranged to electrically connect the LO buffer to the signal node of the signal path, wherein the LO buffer is reused for a transmit (TX) function through the auxiliary path;
    wherein when the LO buffer is reused for the TX function through the auxiliary path, at least a portion of circuits at the signal path is disabled.

2. The semiconductor chip of claim 1, wherein the first wireless communication circuit is a part of a receive (RX) circuit, the signal path is an RX signal path, and the signal node is coupled to an antenna, where the antenna is reused for the TX function when the LO buffer is electrically connected to the signal node through the auxiliary path.

3. The semiconductor chip of claim 2, wherein the LO buffer is an RX LO buffer of the RX circuit and is further coupled to the mixer input port.

4. The semiconductor chip of claim 2, further comprising:
    a second wireless communication circuit, comprising the LO buffer.

5. The semiconductor chip of claim 4, wherein the second wireless communication circuit is a part of an RX circuit, and the LO buffer is an RX LO buffer of the second wireless communication circuit.

6. The semiconductor chip of claim 5, wherein the first wireless communication circuit and the second wireless communication circuit belong to a same wireless communication system.

7. The semiconductor chip of claim 5, wherein the first wireless communication circuit and the second wireless communication circuit belong to different wireless communication systems.

8. The semiconductor chip of claim 4, wherein the second wireless communication circuit is a part of a TX circuit, and the LO buffer is a TX LO buffer of the second wireless communication circuit.

9. The semiconductor chip of claim 8, wherein the first wireless communication circuit and the second wireless communication circuit belong to a same wireless communication system.

10. The semiconductor chip of claim 8, wherein the first wireless communication circuit and the second wireless communication circuit belong to different wireless communication systems.

11. The semiconductor chip of claim 1, wherein the first wireless communication circuit is a part of a TX circuit, the signal path is a TX signal path, and the signal node is coupled to an antenna, where the antenna is reused for the TX function when the LO buffer is electrically connected to the signal node through the auxiliary path.

12. The semiconductor chip of claim 11, wherein the LO buffer is a TX LO buffer of the TX circuit and is further coupled to the mixer input port.

13. The semiconductor chip of claim 11, further comprising:
a second wireless communication circuit, comprising the LO buffer.

14. The semiconductor chip of claim 13, wherein the second wireless communication circuit is a part of a receive (RX) circuit.

15. The semiconductor chip of claim 14, wherein the first wireless communication circuit and the second wireless communication circuit belong to a same wireless communication system.

16. The semiconductor chip of claim 14, wherein the first wireless communication circuit and the second wireless communication circuit belong to different wireless communication systems.

17. The semiconductor chip of claim 13, wherein the second wireless communication circuit is a part of a TX circuit, and the LO buffer is a TX LO buffer of the second wireless communication circuit.

18. The semiconductor chip of claim 17, wherein the first wireless communication circuit and the second wireless communication circuit belong to a same wireless communication system.

19. The semiconductor chip of claim 17, wherein the first wireless communication circuit and the second wireless communication circuit belong to different wireless communication systems.

20. The semiconductor chip of claim 1, wherein the LO buffer is equipped with a mixer function.

21. The semiconductor chip of claim 1, wherein the first wireless communication circuit belongs to a Radio Detection and Ranging (RADAR) system.

22. A semiconductor chip comprising:
a first wireless communication circuit, comprising a signal path, wherein the signal path comprises a mixer input port and a signal node distinct from the mixer input port;
a local oscillator (LO) buffer, arranged to receive and buffer an LO signal; and
an auxiliary path, arranged to electrically connect the LO buffer to the signal node of the signal path, wherein the LO buffer is reused for a transmit (TX) function through the auxiliary path;
wherein the signal path further comprises a balanced-to-unbalanced (balun) circuit, and the signal node is an ungrounded terminal on an unbalanced side of the balun circuit.

23. The semiconductor chip of claim 20, wherein the auxiliary path comprises:
a P-type metal-oxide-semiconductor (PMOS) based amplifier, where the balun circuit is reused as an output load of the PMOS based amplifier when the PMOS based amplifier is enabled to drive the signal node according to an output signal of the LO buffer.

24. A transmission method comprising:
electrically connecting, by an auxiliary path, a local oscillator (LO) buffer that is arranged to receive and buffer an LO signal to a signal node of a signal path in a wireless communication circuit, wherein the signal path further comprises a mixer input port that is distinct from the signal node;
reusing the LO buffer for a transmit (TX) function through the auxiliary path; and
in response to the LO buffer being reused for the TX function through the auxiliary path, disabling at least a portion of circuits at the signal path.

* * * * *